United States Patent
Fitzsimmons et al.

(10) Patent No.: US 6,917,108 B2
(45) Date of Patent: Jul. 12, 2005

(54) RELIABLE LOW-K INTERCONNECT STRUCTURE WITH HYBRID DIELECTRIC

(75) Inventors: John A. Fitzsimmons, Poughkeepsie, NY (US); Stephen E. Greco, LaGrangeville, NY (US); Jia Lee, Beacon, NY (US); Stephen M. Gates, Ossining, NY (US); Terry Spooner, New Fairfield, CT (US); Matthew S. Angyal, Stormville, NY (US); Habib Hichri, Wappingers Falls, NY (US); Theordorus E. Standaert, Wappingers Falls, NY (US); Glenn A. Biery, Staatsburg, NY (US)

(73) Assignee: International Business Machines Corporation, Armonk, NY (US)

(*) Notice: Subject to any disclaimer, the term of this patent is extended or adjusted under 35 U.S.C. 154(b) by 10 days.

(21) Appl. No.: 10/294,139

(22) Filed: Nov. 14, 2002

(65) Prior Publication Data

US 2004/0094839 A1 May 20, 2004

(51) Int. Cl.[7] .................. H01L 23/48; H01L 23/52; H01L 29/40
(52) U.S. Cl. .................. 257/751; 257/758
(58) Field of Search .................. 257/751, 758, 257/760

(56) References Cited

U.S. PATENT DOCUMENTS

| | | |
|---|---|---|
| 6,159,842 A | 12/2000 | Chang et al. |
| 6,187,663 B1 | 2/2001 | Yu et al. |

(Continued)

FOREIGN PATENT DOCUMENTS

| | | |
|---|---|---|
| EP | 1 120 822 A1 | 8/2001 |
| WO | WO 02/083327 | 10/2002 |

OTHER PUBLICATIONS

Robust 130nm–Node Cu Dual Damascene Technology with Low-k Barrier SiCN, H. Aoki, K. Turii, T. Oshima, J. Noguchi, U. Tanaka, H. Yamaguchi, T. Saito, N. Miura, T. Tamaru, N. Konishi, S. Uno, S. Morita, T. Fujii, and K. Hinode, Device Development Center, Hitachi, Ltd.; 2001 IEEE, 76–IEDM 01.

A 0.11um CMOS Technology with Copper and Very–low–k Interconnects for High–Performance System–On–a Chip Cores, Y. Takao, H. Kudo, J. Mitani, Y. Kotani, S. Yamagushi, K. Yoshie, and M. Kawano, manufacturing Technology Development Division, Fujitsu Limited; 2000 IEEE, IEDM 00–559.

A High Performance 0.13um Copper DEOL Technology with Low–k Dielectric; R.D. Goldblatt, B. Agarwala, M.B. Anand, E.P. Barth, G.A. Biery, Z.G. Chen, S. Cohen, J.B. Connolly, A. Cowley, T. Dalton, S.K. Das, C.R. Davis, A Deutsch, C. DeWan, D.C. Edelstein, P.A. Emmi, C.G. Faltermeier, J.A. Fitzsimmons, J. Hedrick, J.E. Heidenreich, C.K. Hu, J.P. Hummel, P. Jones, E. Kaltalioglu, B.E. Kastenmeier, M. Krishnan, W.F. Landers, E. Liniger, J. Kiu, N.E. Lustig, S. Malhotra, D.K. Manger, V. McGahay, R. Mih, H.A. Nye, S. Purushothaman, H.A. Rathore, S.C. Seo, T.M. Shaw, A.H. Simon, T.A. Spooner, M. Stetter, R.A. Wachnik, J.G. Ryan, IBM Semiconductor Research and Development Center and Infineon Technologies Inc., 2000IEEE.

(Continued)

*Primary Examiner*—Phat X. Cao
(74) *Attorney, Agent, or Firm*—Lisa U. Jaklitsch (57) ABSTRACT

An advanced back-end-of-line (BEOL) interconnect structure having a hybrid dielectric is disclosed. The inter-layer dielectric (ILD) for the via level is preferably different from the ILD for the line level. In a preferred embodiment, the via-level ILD is formed of a low-k SiCOH material, and the line-level ILD is formed of a low-k polymeric thermoset material.

32 Claims, 5 Drawing Sheets

U.S. PATENT DOCUMENTS

| | | | |
|---|---|---|---|
| 6,245,662 B1 | 6/2001 | Naik et al. | |
| 6,265,779 B1 * | 7/2001 | Grill et al. | 257/759 |
| 6,265,780 B1 | 7/2001 | Yew et al. | |
| 6,358,842 B1 | 3/2002 | Zhou et al. | |
| 6,362,091 B1 | 3/2002 | Andideh et al. | |
| 6,380,091 B1 | 4/2002 | Wang et al. | 438/706 |
| 6,383,920 B1 | 5/2002 | Wang et al. | |
| 6,391,757 B1 | 5/2002 | Huang et al. | |
| 6,395,632 B1 | 5/2002 | Farrar | |
| 6,406,994 B1 | 6/2002 | Ang et al. | |
| 6,472,306 B1 | 10/2002 | Lee et al. | |
| 6,486,557 B1 | 11/2002 | Davis et al. | 257/758 |
| 6,573,604 B1 * | 6/2003 | Kajita | 257/758 |
| 2002/0024150 A1 | 2/2002 | Farrar | |
| 2002/0048929 A1 | 4/2002 | Naik et al. | |
| 2002/0048931 A1 | 4/2002 | Farrar | |
| 2002/0052125 A1 | 5/2002 | Shaffer, II et al. | |
| 2002/0117737 A1 | 8/2002 | Gates et al. | |
| 2002/0117754 A1 | 8/2002 | Gates et al. | |
| 2002/0117760 A1 | 8/2002 | Gates et al. | |
| 2002/0130416 A1 | 9/2002 | Wang et al. | 257/758 |
| 2002/0130417 A1 | 9/2002 | Yew et al. | 257/758 |
| 2002/0137323 A1 * | 9/2002 | Loboda | 438/600 |
| 2002/0164865 A1 | 11/2002 | Furusawa et al. | 438/484 |
| 2002/0164889 A1 | 11/2002 | Tsai et al. | 438/763 |
| 2003/0001273 A1 | 1/2003 | Steiner et al. | 257/760 |
| 2003/0089988 A1 * | 5/2003 | Matsuura | 257/758 |
| 2003/0183939 A1 * | 10/2003 | Kakamu et al. | 257/762 |

OTHER PUBLICATIONS

M. Tada et al: "Copper Dual Damascene Interconnects in Porous Organosilica Film with Organic Hard–mask and Etch–stop layers fro 70nm–node ULSIs" Proc. IEEE Int. Interconnect Conf. 2002, Burlingame USA, May 3–6, 2002 pp.12–14.

Hasegawa T et al: "Copper Dual Damascene Interconnects With Low–K (Koff <3.0) Dielectrics Using Flare(TM) and an Organo–Silicate Hard Mask" International Electron Devices Meeting 1999 IEDM. Technical Digest. Washington, DC, Dec. 5–8, 1999 New York, NY: IEEE US, Aug. 1, 2000 pp. 623–626.

T. Usami et al.: "Stopper–less Hybrid Low–k/Cu DD Structure Fabrication Combined with Low–k CMP" Proc. IEEE Int. Interconnect Conf. 2002, Burlingame USA May 3–5, 2002 pp. 250–252.

* cited by examiner (PRIOR ART)
FIG. 1

RELIABLE LOW-K INTERCONNECT STRUCTURE WITH HYBRID DIELECTRIC

FIELD OF THE INVENTION

This invention relates generally to the manufacture of high speed semiconductor microprocessors, application specific integrated circuits (ASICs), and other high speed integrated circuit devices. More particularly, this invention relates to advanced back-end-of-line (BEOL) metallization structures for semiconductor devices using low-k dielectric materials. The invention is specifically directed to an advanced BEOL interconnect structure having a hybrid dielectric with a low dielectric constant.

BACKGROUND OF THE INVENTION

Metal interconnections in very large scale integrated (VLSI) or ultra-large scale integrated (ULSI) circuits typically consist of interconnect structures containing patterned layers of metal wiring. Typical integrated circuit (IC) devices contain from three to fifteen layers of metal wiring. As feature size decreases and device area density increases, the number of interconnect layers is expected to increase.

The materials and layout of these interconnect structures are preferably chosen to minimize signal propagation delays, hence maximizing the overall circuit speed. An indication of signal propagation delay within the interconnect structure is the RC time constant for each metal wiring layer, where R is the resistance of the wiring and C is the effective capacitance between a selected signal line (i.e., conductor) and the surrounding conductors in the multilevel interconnect structure. The RC time constant may be reduced by lowering the resistance of the wiring material. Copper is therefore a preferred material for IC interconnects because of its relatively low resistance. The RC time constant may also be reduced by using dielectric materials with a lower dielectric constant, k.

High speed logic chips require faster interconnects, as the interconnect delay is now limiting the overall circuit speed. With scaling to smaller dimensions, the interconnect delay becomes a more significant factor limiting overall circuit performance. Throughout the semiconductor industry, interconnect structures using copper conductors within a low-k insulator are being introduced to reduce the interconnect delay. One measure of interconnect delay is the effective dielectric constant k(eff) of the interconnect structure. To obtain a lower k(eff) and hence reduced delay, both a low-k dielectric (k<4) and lower k barriers (e.g., k<7 for silicon nitride) must be used.

Figure 1:
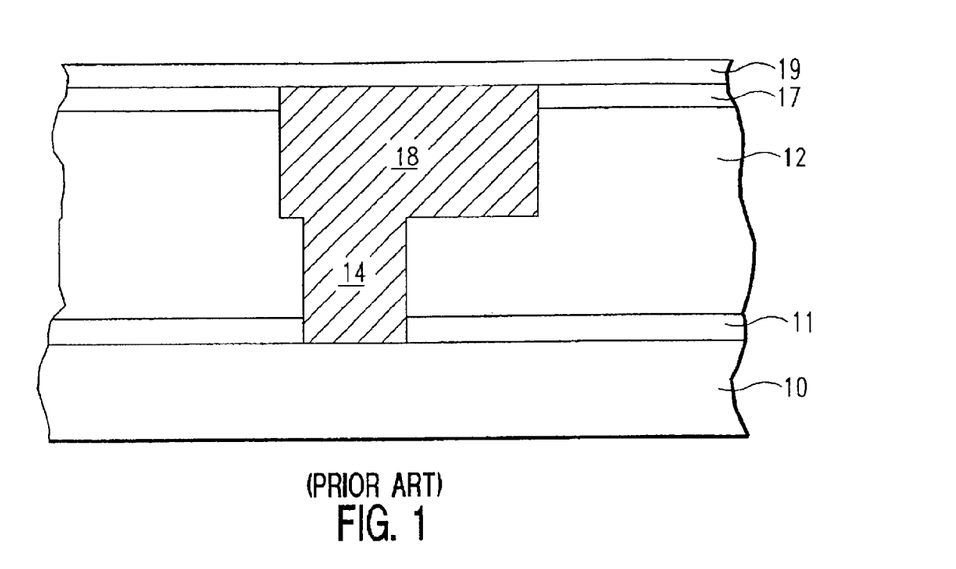
FIG. 1 is a schematic cross-sectional view of a partially-fabricated integrated circuit device illustrating a prior art interconnect structure.

State-of-the-art dual damascene interconnect structures comprising low-k dielectric material and copper interconnects are described in "A High Performance 0.13 μm Copper BEOL Technology with Low-k Dielectric," by R. D. Goldblatt et al., Proceedings of the IEEE 2000 International Interconnect Technology Conference, pp. 261–263. A typical interconnect structure using low-k dielectric material and copper interconnects is shown in FIG. 1. The interconnect structure comprises a lower substrate 10 which may contain logic circuit elements such as transistors. A cap layer 11 may be disposed above lower substrate 10. A dielectric layer 12, commonly known as an inter-layer dielectric (ILD), overlies the substrate 10 and optional cap layer 11. In advanced interconnect structures, ILD layer 12 is preferably a low-k polymeric thermoset material such as SiLK™ (an aromatic hydrocarbon thermosetting polymer available from The Dow Chemical Company). At least one conductor 14, 18 is embedded in ILD layer 12. Conductor 14, 18 is typically copper in advanced interconnect structures, but may alternatively be aluminum or other conductive material. A diffusion barrier liner (not shown) may be disposed between ILD layer 12 and conductor 14, 18. Such diffusion barrier liner may be comprised of tantalum, titanium, tungsten or nitrides of these metals. A cap layer 17 of, e.g., silicon nitride may be disposed on ILD layer 12. The top surface of conductor 18 is made coplanar with the top surface of silicon nitride layer 17, usually by a chemical-mechanical polish (CMP) step. A final cap layer 19, also of, e.g., silicon nitride, may be disposed over the entire structure.

Conductor 14, 18 may be formed by conventional dual damascene processes. For example, formation of the interconnect level shown begins with deposition of ILD material 12 onto cap layer 11. If the ILD material is a low-k polymeric thermoset material such as SiLK™, the ILD material is typically spin-applied, given a post apply hot bake to remove solvent, and cured at elevated temperature. Next, silicon nitride layer 17 is deposited on ILD layer 12. Silicon nitride layer 17, ILD layer 12, and cap layer 11 are then patterned, using a conventional photolithography and etching process, to form at least one trench 18 and via 14. The trenches and vias may be lined with a diffusion barrier liner. The trenches and vias are then filled with a metal such as copper to form conductor 14, 18 in a conventional dual damascene process. Excess metal is removed by a chemical-mechanical polish (CMP) process. Finally, silicon nitride cap layer 19 is deposited on copper conductor 18 and silicon nitride layer 17.

In advanced interconnect structures, a preferable low-k dielectric material is a polymeric thermoset material such as SiLK™ (an aromatic hydrocarbon thermosetting polymer available from The Dow Chemical Company). This material has a dielectric constant of about 2.65. However, copper interconnect structures using such low-k materials as the ILD can suffer from reliability problems, including mechanical failure caused by thermal expansion of the low-k dielectric materials. The modulus of SiLK™ dielectric is 2.7 Gpa, while that of silicon dioxide is 78 Gpa. This difference has been shown to significantly contribute to such reliability problems.

Thus, there is a need in the art for an advanced interconnect structure having a low k(eff) that does not suffer from the reliability problems caused by thermal expansion of polymeric low-k dielectric materials.

U.S. Pat. No. 6,362,091 to Andideh et al. describes an interconnect structure having a multi-layer low-k ILD. Andideh et al. were trying to solve the problem of cracking in relatively brittle low-k carbon-doped silicon films, rather than reliability problems caused by thermal expansion of polymeric low-k dielectric materials. To solve this problem, a multi-layer ILD was proposed comprising alternating layers of a low-k dielectric such as carbon-doped silicon with a second insulating material having increased toughness such as silicon dioxide. Although it is disclosed that the low-k dielectric material may comprise a low-k polymer, it is clear from the disclosure that the problems discussed above with respect to the difference between the modulus for a polymeric low-k dielectric such as SiLK™ and the modulus for silicon dioxide were not recognized by Andideh et al. Moreover, the second insulating materials (having increased toughness) proposed here ($SiO_2$, SiN, SiON, SiOF and SiC) all have relatively high dielectric constants rendering the k(eff) of the multi-layer ILD comparatively high. Finally, the manufacture of this structure is made very difficult by using the same multi-layer ILD for the via level and the line level, with no intermediate cap layer or etch stop layer.

Thus, there is still a need in the art for an advanced interconnect structure having a low k(eff) that does not suffer from the reliability problems caused by thermal expansion of polymeric low-k dielectric materials.

SUMMARY OF THE INVENTION

The problems described above are addressed through use of the present invention, which is directed to an interconnect structure formed on a substrate. In one embodiment, the structure comprises: a first dielectric layer overlying the substrate; a first hardmask layer on the first dielectric layer, the first hardmask layer having a top surface; at least one conductive via embedded in the first dielectric layer and the first hardmask layer; a via-level cap layer on the first hardmask layer; a second dielectric layer on the via-level cap layer, wherein the second dielectric layer is formed of a material different from the first dielectric layer; a second hardmask layer on the second dielectric-layer, the second hardmask layer having a top surface; and at least one conductive line embedded in the via-level cap layer, the second dielectric layer and the second hardmask layer, the conductive line having a top surface co-planar with the top surface of the second hardmask layer.

In another embodiment, the structure comprises: a first dielectric layer overlying the substrate; an etch stop layer on the first dielectric layer; an adhesion promoter layer on the etch stop layer; a second dielectric layer on the adhesion promoter layer, wherein the second dielectric layer is formed of a material different from the first dielectric layer; a hardmask layer on the second dielectric layer, the hardmask layer having a top surface; at least one conductive via embedded in the first dielectric layer and the etch stop layer; and at least one conductive line embedded in the adhesion promoter layer, the second dielectric layer and the hardmask layer, the conductive line having a top surface co-planar with the top surface of the hardmask layer.

The present invention is also directed to a method of forming an interconnect structure on a substrate. In one embodiment, the method comprises the steps of: depositing a first dielectric layer on the substrate; depositing a first hardmask layer on the first dielectric layer, the first hardmask layer having a top surface; forming at least one via opening in the first dielectric layer and the first hardmask layer; filling the via opening with a conductive material, thereby forming at least one conductive via embedded in the first dielectric layer and the first hardmask layer; depositing a via-level cap layer on the first hardmask layer; depositing a second dielectric layer on the via-level cap layer, wherein the second dielectric layer is formed of a material different from the first dielectric layer; depositing a second hardmask layer on the second dielectric layer, the second hardmask layer having a top surface; forming at least one trench opening in the via-level cap layer, the second dielectric layer and the hardmask layer, wherein the second opening overlies the first conductive via; and filling the trench opening with a conductive material, thereby forming at least one conductive line embedded in the via-level cap layer, the second dielectric layer and the second hardmask layer, the conductive line having a top surface co-planar with the top surface of the second hardmask layer.

In another embodiment, the method comprises the steps of: depositing a first dielectric layer on the substrate; depositing an etch stop layer on the first dielectric layer, the etch stop layer having a top surface; depositing an adhesion promoter layer on the etch stop layer; depositing a second dielectric layer on the adhesion promoter layer, wherein the second dielectric layer is formed of a material different from the first dielectric layer; depositing a hardmask layer on the second dielectric layer, the hardmask layer having a top surface; forming at least one via opening in the hardmask layer, the second dielectric layer, the adhesion promoter layer, the first dielectric layer and the etch stop layer; forming at least one trench opening in the hardmask layer, the second dielectric layer and the adhesion promoter layer, wherein the trench opening overlies the via opening; filling the via and trench openings with a conductive material, thereby forming at least one via conductor and at least one line conductor embedded in the first dielectric layer, the etch stop layer, the adhesion promoter layer, the second dielectric layer and the hardmask layer, the line conductor having a top surface co-planar with the top surface of the hardmask layer.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION OF THE INVENTION

The invention will now be described by reference to the accompanying figures. In the figures, various aspects of the structures have been shown and schematically represented in a simplified manner to more clearly describe and illustrate the invention. For example, the figures are not intended to be to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

Although certain aspects of the invention will be described with respect to a structure comprising copper, the invention is not so limited. Although copper is the preferred conductive material, the structure of the present invention may comprise any suitable conductive material, such as aluminum.

Figure 2A:
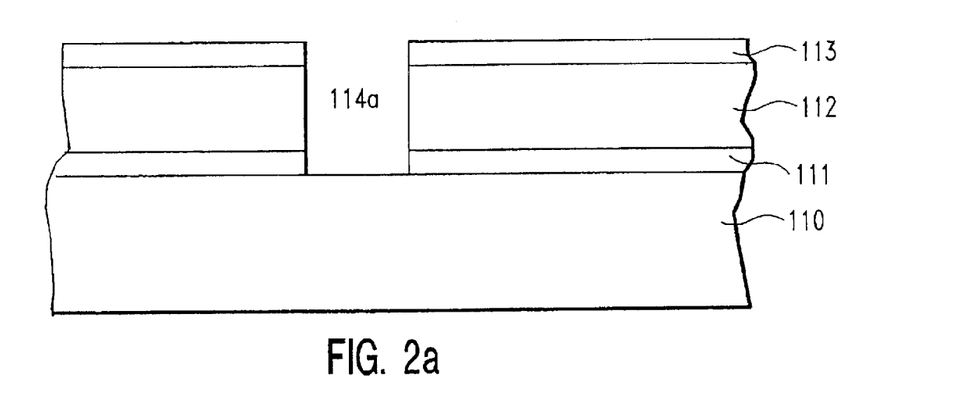
FIGS. 2(a)–2(e) are schematic cross-sectional views of a partially-fabricated integrated circuit device illustrating a method for forming an interconnect structure in accordance with a preferred embodiment of the invention.
Figure 2B:
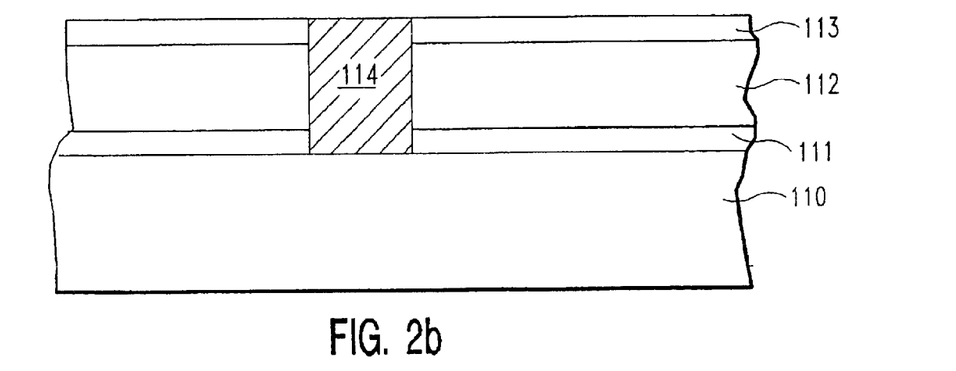
Figure 2C:
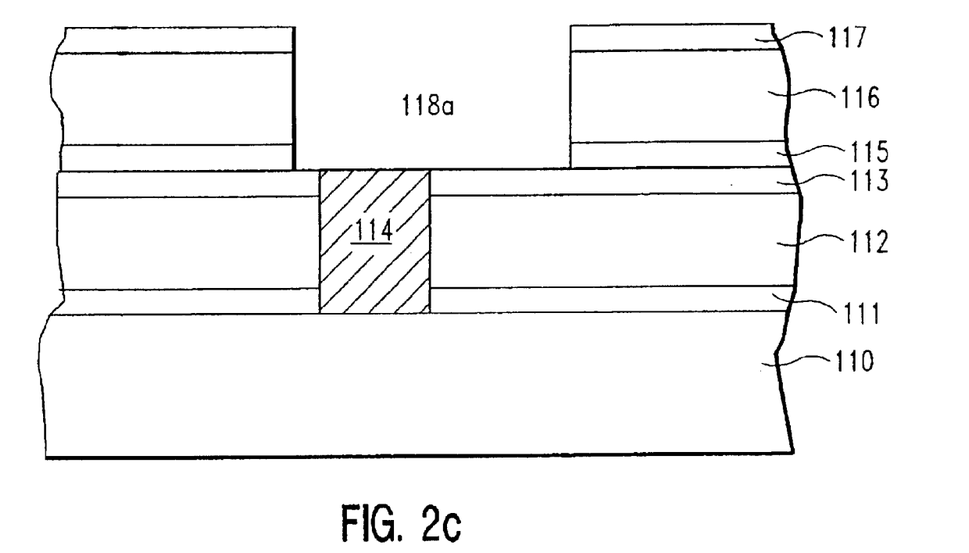
Figure 2D:
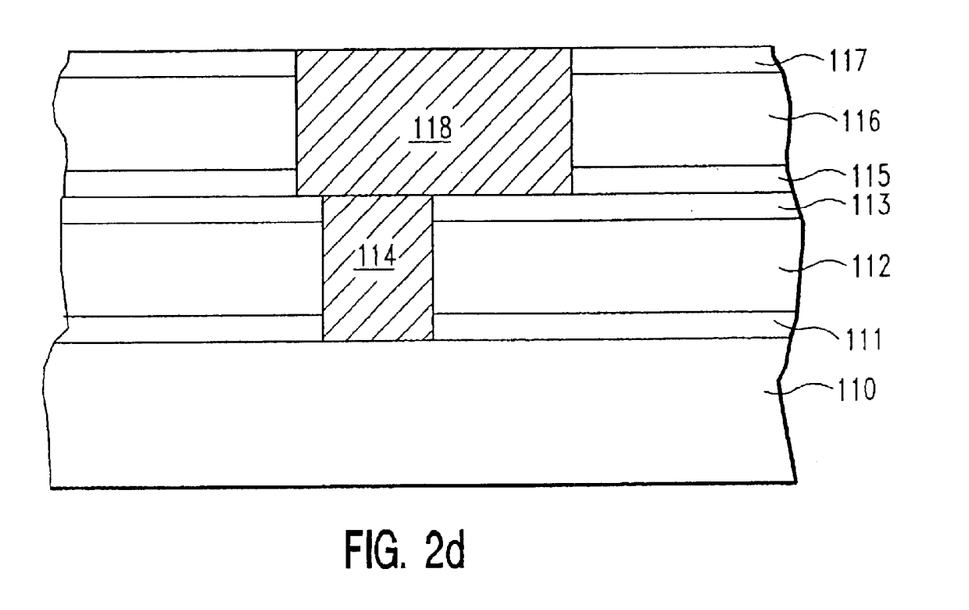
Figure 2E:
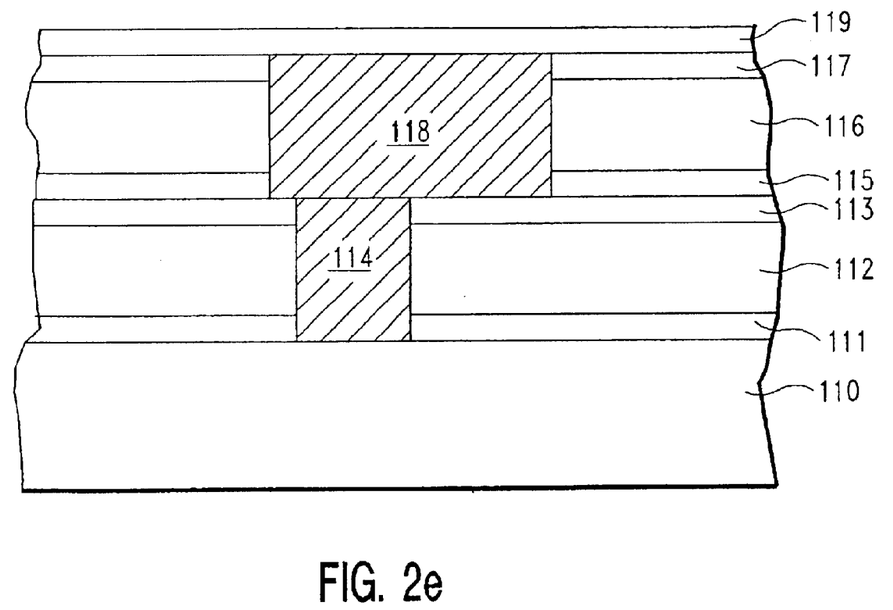

Referring to FIG. 2(e), a preferred embodiment of the interconnect structure of this invention comprises a lower substrate 110 which may contain logic circuit elements such as transistors, and may terminate with a single damascene wiring level and/or cap layer, which may be formed of a material the same as or different from the conductors and cap layers discussed hereafter. For example, substrate 110 may terminate with a wiring level comprising tungsten, while conductors 114 and 118 discussed below may be formed of copper.

A cap layer 111 may be disposed on lower substrate 110. A dielectric layer 112, commonly known as an inter-layer dielectric (ILD), overlies cap layer 111. A via-level hardmask layer 113 is preferably disposed on ILD layer 112. At least one via conductor 114 is embedded in ILD layer 112, cap layer 111 and via hardmask layer 113. A diffusion barrier liner (not shown) may be disposed between ILD layer 112 and via conductor 114. The top surface of via conductor 114 is made coplanar with the top surface of via hardmask layer 113, usually by a chemical-mechanical polish (CMP) step.

A first interconnect level is defined by cap layer 111, ILD layer 112, hardmask layer 113, and via conductor 114 in the interconnect structure shown in FIG. 2(e). A second interconnect level, shown above the first interconnect level in FIG. 2, includes via cap layer 115, ILD layer 116, line hardmask layer 117, and line conductor 118. An adhesion promoter layer (not shown) may be disposed between via cap layer 115 and ILD layer 116. A final cap layer 119 overlies line conductor 118 and line hardmask layer 117.

Figure 3A:
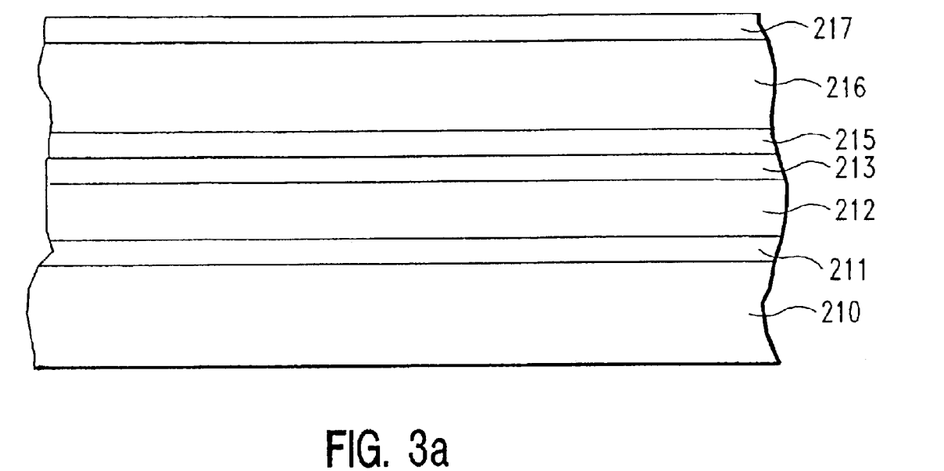
FIGS. 3(a)–3(d) are schematic cross-sectional views of a partially-fabricated integrated circuit device illustrating a method for forming an interconnect structure in accordance with another preferred embodiment of the invention.
Figure 3B:
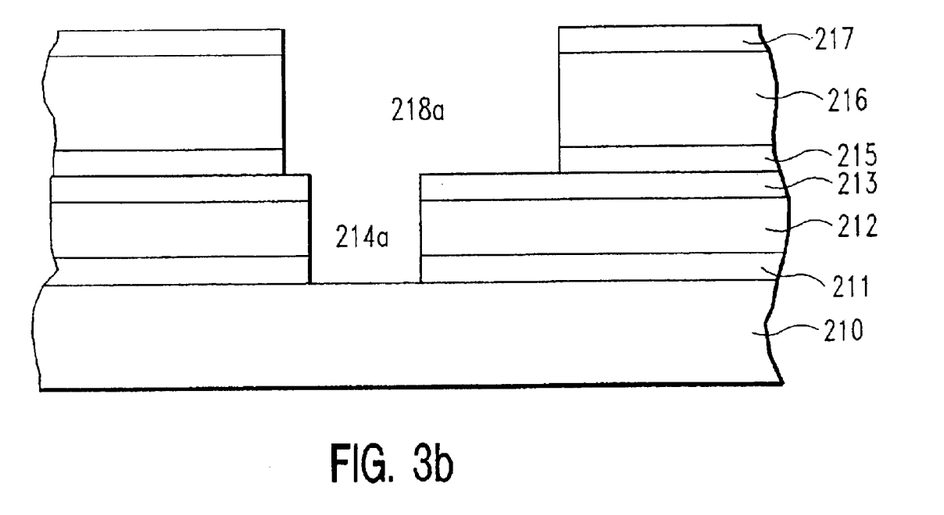
Figure 3C:
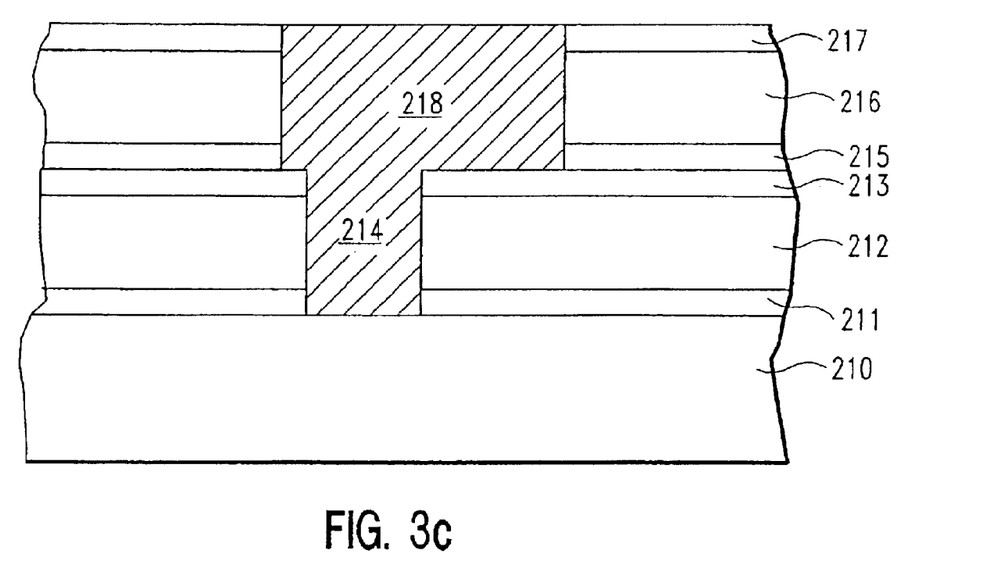
Figure 3D:
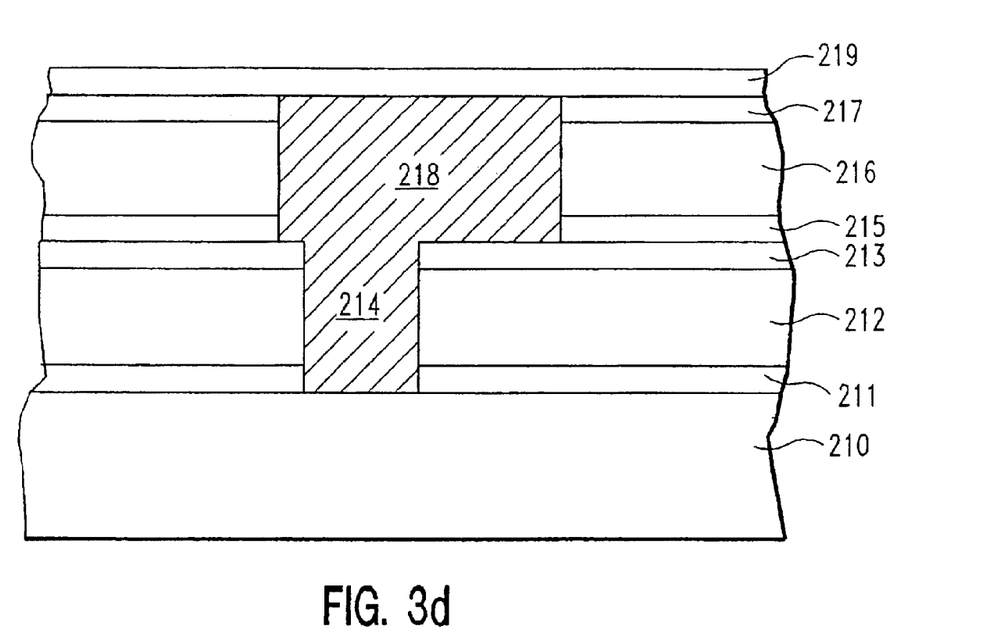

Another preferred embodiment of the interconnect structure of this invention is shown in FIG. 3(d). This embodiment comprises a lower substrate 210 which may contain logic elements such as transistors. A cap layer 211 may be disposed on lower substrate 210. ILD layer 212 overlies cap layer 211. An etch stop layer 213 is disposed on ILD layer 212. An adhesion promoter layer 215 is disposed on etch stop layer 213. ILD layer 216 is deposited on adhesion promoter layer 215, and hardmask layer 217 overlies ILD layer 216. At least one via conductor 214 and line conductor 218 are embedded in layers 211, 212, 213, 215, 216 and 217 as shown. The top surface of line conductor 218 is made coplanar with the top surface of hardmask layer 217. A final cap layer 219 overlies line conductor 218 and hardmask layer 217.

ILD layers 112, 116, 212 and 216 may be formed of any suitable dielectric material, although low-k dielectric materials are preferred. Suitable dielectric materials include carbon-doped silicon dioxide materials; fluorinated silicate glass (FSG); organic polymeric thermoset materials, silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Novellus). An example of an HSQ material is FOx™ (available from Dow Corning). Preferred dielectric materials include organic polymeric thermoset materials, consisting essentially of carbon, oxygen and hydrogen, including the low-k polyarylene ether polymeric material known as SiLK™ (available from The Dow Chemical Company), and the low-k polymeric material known as FLARE™ (available from Honeywell).

In a preferred embodiment, via-level W-D layers 112 and 212 are formed of a material having a low coefficient of thermal expansion (CTE) such as SiCOH or oxide dielectric material to improve reliability, and line-level ILD layers 116 and 216 are formed of a polymeric thermoset material having a low k such as SiLK™. It is particularly preferred that via-level ILD layers 112 and 212 be formed of a dielectric material having a CTE of less than about 50 ppm/°C. and preferably to match the CTE of conductors 114 and 214.

In a particularly preferred embodiment, via-level ILD layers 112 and 212 are formed of SiCOH, and line-level ILD layers 116 and 216 are formed of SiLK™. In another embodiment, via-level ILD layers 112 and 212 may be formed of SiCOH, and line-level ILD layers 116 and 216 may be formed of porous SiLK™. In yet another embodiment, via-level ILD layers 112 and 212 may be formed of porous SiCOH, and line-level ILD layers 116 and 216 may be formed of SiLK™. In yet another embodiment, via-level ILD layers 112 and 212 may be formed of porous SiCOH, and line-level ILD layers 116 and 216 may be formed of porous SiLK™. In yet another embodiment, via-level ILD layers 112 and 212 may be formed of porous SiCOH, and line-level ILD layers 116 and 216 may be formed of SiCOH. In yet another embodiment, via-level ILD layers 112 and 212 may be formed of SiCOH, and line-level ILD layers 116 and 216 may be formed of porous SiCOH.

ILD layers 112, 116, 212 and 216 may each be about 10 nm to about 1000 nm thick, but these layers are each preferably about 120 nm thick. The dielectric constant for ILD layers 112, 116, 212 and 216 is preferably about 1.8 to about 3.5, and most preferably about 2.5 to about 2.9. In embodiments using porous materials for both line-level and via-level ILD, the materials for ILD layers 112, 116, 212 and 216 are porous materials, thereby further reducing the dielectric constant for these layers to the range of about 1.8 to 2.5.

Hardmask layer 113 and etch stop layer 213 may be formed of any suitable dielectric material. Layers 113 and 213 preferably have the following characteristics: (1) a low dielectric constant (preferably less than about 7); (2) a low CMP rate relative to the liner (preferably about 1:5) and therefore acts as a CMP stop layer; (3) is hydrophilic for effective post-CMP cleaning; (4) acts as a barrier to copper diffusing into the underlying dielectric; and (5) is resistant to oxygen plasma used during resist strip operations. Preferred materials for layers 113 and 213 include SiCH and SiNCH, such as Blok™ (available from Applied Materials, Inc.)., and have a dielectric constant of less than about 5, and preferably about 4.9. Specifically, these layers are preferably composed of about 20 to 34 atomic % silicon, about 12 to 34 atomic % carbon, about 5 to 30 atomic % nitrogen, and about 20 to 50 atomic % hydrogen. The material preferably has the composition $Si_xC_yN_wH_z$, where x is about 0.2 to about 0.34, y is about 0.12 to about 0.34, w is about 0.05 to about 0.3, and z is about 0.2 to about 0.5. A particularly preferred composition for the SiNCH material is about 22 to 30 atomic % silicon, about 15 to 30 atomic % carbon, about 10 to 22 atomic % nitrogen, and about 30 to 45 atomic % hydrogen. This particularly preferred composition may be expressed as $Si_xC_yN_wH_z$, where x is about 2.2 to about 3, y is about 1.5 to about 3, w is about 1 to about 2, and z is about 3 to about 4.5. The most preferred embodiment utilizes more than one via hardmask layer, wherein the bottom layer has the lowest dielectric constant and highest CMP selectivity.

Via cap layer 115 may be formed of any suitable dielectric material. Via cap layer 115 preferably has the following characteristics: (1) a low dielectric constant; (2) resistance to oxygen plasma used during resist strip operations; (3) acts as a copper barrier; and (4) has etch selectivity properties and therefore acts as an etch stop layer. A particularly preferred material for via cap layer 115 is an amorphous nitrogenated hydrogenated silicon carbide comprising silicon, carbon, nitrogen and hydrogen (SiCNH), having a dielectric constant of less than about 5. Other suitable materials include SiN, SiCH and SiON.

Adhesion promoter layer 215 preferably has the following characteristics: (1) low dielectric constant; (2) low moisture interaction; (3) increases oxidation resistance; and (4) RIE chemistry selectivity with respect to ILD layer 216 and via hardmask layer 213. Particularly preferred materials for adhesion promoter layer 215 include siloxane or SiCOH, most preferably HOSP BESt™ (available from Honeywell).

Hardmask layers 117 and 217 may be formed of any suitable dielectric material, but preferably are formed of a dielectric material having a dielectric constant less than about 5. Preferred materials for hardmask layers 117 and 217 are SiCOH and SiCH. In the most preferred embodiment, these hardmask layers have a dielectric constant less than about 3.5.

Final cap layers 119 and 219 may be formed of any suitable dielectric material, but preferably is formed of SiNCH or SiN. When the final cap layer is formed of SiNCH, this layer is preferably composed of about 20 to 34 atomic % silicon, about 12 to 34 atomic % carbon, about 5 to 30 atomic % nitrogen, and about 20 to 50 atomic % hydrogen. The material preferably has the composition $Si_xC_yN_wH_z$, where x is about 0.2 to about 0.34, y is about 0.12 to about 0.34, w is about 0.05 to about 0.3, and z is about 0.2 to about 0.5. A particularly preferred composition for the SiNCH material is about 22 to 30 atomic % silicon, about 15 to 30 atomic % carbon, about 10 to 22 atomic % nitrogen, and about 30 to 45 atomic % hydrogen. This particularly preferred composition may be expressed as $Si_xC_yN_wH_z$, where x is about 2.2 to about 3, y is about 1.5 to about 3, w is about 1 to about 2, and z is about 3 to about 4.5.

The interconnect structure of FIG. 2(e) may be formed by a single damascene process, such as the process shown in FIGS. 2(a)–2(e). The process optionally begins with deposition of cap layer 111 on substrate 110, and is followed by deposition of ILD layer 112 on cap layer 111, as shown in FIG. 2(a). Cap layer 111 and ILD layer 112 may be deposited by any suitable method. For example, if SiLK™ is used for ILD layer 112, the resin may be applied by a spin-coating process, followed by a baking step to remove solvent and then a thermal curing step.

Via-level hardmask layer 113 is then deposited on ILD layer 112, as shown in FIG. 2(a). Hardmask layer 113 may be deposited by any suitable method, but is preferably deposited by chemical vapor deposition (CVD) directly onto ILD layer 112 when hardmask layer 113 is SiNCH. Alternatively, spin-on glasses may be used for via-level hardmask layer 113. An example of a preferred CVD material is SiCH, and an example of a preferred spin-on material is HOSP BESt™.

Following deposition of a hardmask layer 113, additional sacrificial hardmask layers (not shown) may be deposited. For example, a series of hardmask layers may be deposited, such as the hardmask layers described in co-pending U.S. patent application Ser. No. 09/550,943, filed Apr. 14, 2000 and titled "Protective Hardmask for Producing Interconnect Structures," the disclosure of which is incorporated herein by reference.

Following deposition of cap layer 111, ILD layer 112 and hardmask layer 113, at least one via 114a is formed using a lithography patterning process. Via 114a is then formed by removing hardmask layer 113 and a portion of ILD layer 112 by, for example, reactive ion etching (RIE), in areas not protected by the photoresist. Hardmask layer 113 may assist in this etching step as follows. Hardmask layer 113 may be etched first in areas not covered by the photoresist, then the photoresist may be removed, leaving behind a patterned hardmask layer 113 matching the photoresist pattern. Then, ILD layer 112 and cap layer 111 may be etched in areas not covered by hardmask layer 113.

Following formation of via 114a, the via may be lined with a diffusion barrier liner (not shown), and then a conductive material is deposited in via 114a to form conductor 114, as shown in FIG. 2(b). The diffusion barrier liner may be deposited by any suitable method, such as by physical vapor deposition (PVD), chemical vapor deposition (CVD), atomic layer deposition (ALD) or ionized physical vapor deposition (I-PVD). The diffusion barrier liner may be a multi-layer liner constructed by depositing several refractory metals as a thin film composite. Conductive material 114 may be deposited in via 114a by any suitable method, such as by plating technology. Excess liner material and excess conductive material 114 may be removed in a CMP process, in which the top surface of conductor 114 is made coplanar with the hardmask layer 113. Hardmask layer 113 may serve as a polish-stop layer during this CMP step, thereby protecting ILD layer 112 from damage during polishing. Sacrificial hardmask layers (not shown) may also be removed during this CMP step.

FIGS. 2(a)–2(b) illustrate the formation of the first interconnect level, which comprises cap layer 111, ILD layer 112, hardmask layer 113 and via conductor 115. In FIG. 2(c), the formation of the second interconnect level begins with deposition of via cap layer 115, ILD layer 116 and hardmask layer 117. Additional sacrificial hardmask layers (not shown) may be deposited on primary hardmask layer 117.

In a preferred embodiment, cap layer 115 is a silicon nitride film deposited by CVD. In a particularly preferred embodiment, cap layer 115 is SiCNH deposited by CVD.

ILD layer 116 is preferably formed of a material different from the material for ILD layer 112. If ILD layer 112 is formed of a SiCOH material (preferably deposited by CVD), then ILD layer 116 is preferably formed of a polymeric thermoset material such as SiLK™. If ILD layer 116 is a low-k polymeric material such as SiLK™, the ILD material is typically spin-applied, given a post apply hot bake to remove solvent, and cured at elevated temperature.

Line hardmask layer 117 is preferably formed of a low-k dielectric material such as SiCOH or SiCH, and may be deposited by CVD or spin apply methods. An example of a preferred CVD material is SiCH, and an example of a preferred spin-on material is HOSP BESt™.

Following deposition of via cap layer 115, ILD layer 116 and line hardmask layer 117, at least one trench 118a is formed using a lithography patterning and etching process which may include reactive ion etching (RIE), as shown in FIG. 2(c). Trench 118a may be lined with a diffusion barrier liner (not shown), and then a conductive material is deposited in trench 118a to form conductor 118, as shown in FIG. 2(d). The diffusion barrier liner may be deposited by any suitable method, such as by physical vapor deposition (PVD), chemical vapor deposition (CVD), atomic layer deposition (ALD) or ionized physical vapor deposition (I-PVD). The diffusion barrier liner may be a multi-layer liner constructed by depositing several refractory metals as a thin film composite. Conductive material 118 is typically the same material used for conductive via 114, and may be deposited in trench 118a by any suitable method, such as by plating technology. Excess liner material and excess conductive material 118 may be removed in a CMP process, in which the top surface of conductor 118 is made coplanar with the line hardmask layer 117.

After conductors 114 and 118 are formed, final cap layer 119 may be deposited as shown in FIG. 3(d). Final cap layer 119 may be formed of any suitable dielectric material, but is preferably formed of SiCNH or SiN deposited by CVD.

As an alternative to the single damascene method described above and shown in FIGS. 2(a)–2(e), the interconnect structure of this invention may be formed using a dual damascene method, such as the method shown in FIGS. 3(a)–3(d). This alternative process optionally begins with deposition of cap layer 211 on substrate 210, and is followed by deposition of ILD layer 212 on cap layer 211.

A bilayer etch stop is then constructed by first depositing etch stop layer 213 on ILD layer 212, then depositing adhesion promoter layer 215 sequentially onto etch stop layer 213. Layer 213 is deposited preferably by CVD and is most preferably SiNCH. Adhesion promoter layer 215 is deposited preferably by spin application methods and is preferably a SiCOH material, most preferably HOSP BESt™.

After adhesion promoter layer 215 is deposited, ILD layer 216 and hardmask layer 217 are deposited. Then, trench 218a and via 214a are formed, as shown in FIG. 3(b), using a conventional lithography process. The dual damascene etch process involves the utilization of sacrificial hardmasks. After line level lithography is performed, the etch process transfers the line level pattern into the hardmask levels except for the non-sacrifical layer 217. Lithography is then performed to pattern the via level. The etch process transfers the via 214a pattern by removing the full hardmask stack (including layer 217) and ILD layer 216, selectively stopping on layer 215. Next, the remaining line-level hardmask layers (including layer 217) are etched. The etch process continues by etching the via pattern into layers 215, 213 and 212, and selectively stopping on layer 211. The ILD layer 212 is etched to further define the line. Finally, the cap layer 211 is etched to complete the via. This final etch step also removes layer 215 in the line pattern to complete the trench 218a.

Via 214a and trench 218a are then filled with conductive material in a dual damascene process to form conductor 214, 218, as shown in FIG. 3(c). Excess conductor material may be removed in a CMP process as described above.

After conductor 214, 218 is formed, final cap layer 219 may be deposited as shown in FIG. 3(d). Final cap layer 219 may be formed of any suitable dielectric material, but is preferably formed of SiCNH or SiN deposited by CVD.

As an alternative to the dual damascene method illustrated in FIGS. 3(a)–3(d), the interconnect structure of this invention may be formed using a simplified dual damascene method as follows. In this alternative dual damascene method, the properties of ILD layer 212 may be adjusted for selectivity in the RIE patterning step, and the RIE step chemistry may be adjusted by, for example, making layers 216 and 212 dissimilar materials, thereby permitting embedded layers 213 and 215 to be omitted from the structure. For example, $CF_4$ may be used to etch SiCOH materials and $N_2/H_2$ may be used to etch polymeric materials such as SiLK.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. An interconnect structure formed on a substrate, the structure comprising:
    a first dielectric layer overlying the substrate, wherein said first dielectric layer is formed of SiCOH;
    a first hardmask layer on said first dielectric layer, said first hardmask layer having a top surface;
    at least one conductive via embedded in said first dielectric layer and said first hardmask layer;
    a via-level layer on said first hardmask layer;
    a second dielectric layer on said via-level cap layer, wherein said second dielectric layer is formed of a material different from said first dielectric layer and said second dielectric layer is formed of a polymeric thermoset material;
    a second hardmask layer on said second dielectric layer, said second hardmask layer having a top surface; and
    at least one conductive line embedded in said via-level cap layer, said second dielectric layer and said second hardmask layer, said conductive line having a top surface co-planar with the top surface of said second hardmask layer.

2. The interconnect structure of claim 1, wherein said first hardmask layer is formed of SiCH or SiNCH.

3. The interconnect structure of claim 1, wherein said via-level cap layer is formed of SiN CH, SiN, SiCH or SiON.

4. The interconnect structure of claim 1, wherein said second hardmask layer is formed of SiCOH or SiCH, and has a dielectric constant of less than about 3.5.

5. The interconnect structure of claim 1, further comprising an adhesion promoter layer disposed between said via-level cap layer and said second dielectric layer.

6. The interconnect structure of claim 1, further comprising a final cap layer on said second hardmask layer and said conductive line.

7. The interconnect structure of claim 1, wherein said second dielectric layer is formed of a porous polymeric thermoset material.

8. The interconnect structure of claim 1, wherein said first dielectric layer is formed of porous SiCOH.

9. The interconnect structure of claim 1, wherein said first dielectric layer is formed of porous SiCOH and said second dielectric layer is formed of a porous polymeric thermoset material.

10. An interconnect structure formed on a substrate, the structure comprising:
    a first dielectric layer overlying the substrate, wherein said first dielectric layer is formed of SiCOH;
    an etch stop layer on said first dielectric layer;
    an adhesion promoter layer on said etch stop layer;
    a second dielectric layer on said adhesion promoter layer, wherein said second dielectric layer is formed of a material different from said first dielectric layer and said second dielectric layer is formed of a polymeric thermoset material;
    a hardmask layer on said second dielectric layer, said hardmask layer having a top surface;

at least one conductive via embedded in said first dielectric layer and said etch stop layer; and at least one conductive line embedded in said adhesion promoter layer, said second dielectric layer and said hardmask layer, said conductive line having a top surface co-planar with the top surface of said hardmask layer.

11. The interconnect structure of claim 10, wherein said etch stop layer is formed of SiCH or SiNCH.

12. The interconnect structure of claim 10, wherein said adhesion promoter layer is formed of SiCOH.

13. The interconnect structure of claim 10, wherein said hardmask layer is formed of SiCOH or SiCH, and has a dielectric constant of less than about 3.5.

14. The interconnect structure of claim 10, further comprising a final cap layer on said hardmask layer and said conductive line.

15. The interconnect structure of claim 10, wherein said second dielectric layer is formed of a porous polymeric thermoset material.

16. The interconnect structure of claim 10, wherein said first dielectric layer is formed of porous SiCOH.

17. The interconnect structure of claim 10, wherein said first dielectric layer is formed of porous SiCOH and said second dielectric layer is formed of a porous polymeric thermoset material.

18. An interconnect structure formed on a substrate, the structure comprising:

a first dielectric layer overlying the substrate, wherein said first dielectric layer is formed of SiCOH;

a second dielectric layer on said first dielectric layer, wherein said second dielectric layer is formed of a polymeric thermoset material;

a hardmask layer on said second dielectric layer, said hardmask layer having a top surface;

at least one conductive via embedded in said first dielectric layer; and at least one conductive line embedded in said second dielectric layer and said hardmask layer, said conductive line having a top surface co-planar with the top surface of said hardmask layer.

19. The interconnect structure of claim 18, wherein said hardmask layer is formed of SiCOH or SiCH, and has a dielectric constant of less than about 3.5.

20. The interconnect structure of claim 18, further comprising a final cap layer on said hardmask layer and said conductive line.

21. The interconnect structure of claim 18, wherein second dielectric layer is formed of a porous polymeric thermoset material.

22. The interconnect structure of claim 18, wherein said first dielectric layer is formed of porous SiCOH.

23. The interconnect structure of claim 18, wherein said first dielectric layer is formed of porous SiCOH and said second dielectric layer is formed of a porous polymeric thermoset material.

24. An interconnect structure formed on a substrate, the structure comprising:

a first dielectric layer overlying the substrate, wherein said first dielectric layer is formed of SiCOH;

a second dielectric layer on said first dielectric layer, wherein said second dielectric layer is formed of SiCOH, and wherein one of said dielectric layers is porous and the other of said dielectric layers is not porous;

a hardmask layer on said second dielectric layer, said hardmask layer having a top surface;

at least one conductive via embedded in said first dielectric layer; and at least one conductive line embedded in said second dielectric layer and said hardmask layer, said conductive line having a top surface co-planar with the top surface of said hardmask layer.

25. The interconnect structure of claim 24, wherein said first dielectric layer is formed of porous SiCOH and said second dielectric layer is formed of SiCOH.

26. The interconnect structure of claim 24, wherein said first dielectric layer is formed of SiCOH and said second dielectric layer is formed of porous SiCOH.

27. An interconnect structure formed on a substrate, the structure comprising:

a first dielectric layer overlying the substrate, wherein said first dielectric layer is formed of SiCOH;

a first hardmask layer on said first dielectric layer, said first hardmask layer having a top surface;

at least one conductive via embedded in said first dielectric layer and said first hardmask layer;

a via-level cap layer on said first hardmask layer;

a second dielectric layer on said via-level cap layer, wherein said second dielectric layer is formed of SiCOH, and wherein one of said dielectric layers is porous and the other of said dielectric layers is not porous;

a second hardmask layer on said second dielectric layer, said second hardmask layer having a top surface; and at least one conductive line embedded in said via-level cap layer, said second dielectric layer and said second hardmask layer, said conductive line having a top surface co-planar with the top surface of said second hardmask layer.

28. The interconnect structure of claim 27, wherein said first dielectric layer is formed of porous SiCOH and said second dielectric layer is formed of SiCOH.

29. The interconnect structure of claim 27, wherein said first dielectric layer is formed of SiCOH and said second dielectric layer is formed of porous SiCOH.

30. An interconnect structure formed on a substrate, the structure comprising:

a first dielectric layer overlying the substrate, wherein said first dielectric layer is formed of SiCOH;

an etch stop layer on said first dielectric layer;

an adhesion promoter layer on said etch stop layer;

a second dielectric layer on said adhesion promoter layer, wherein said second dielectric layer is formed of SiCOH, and wherein one of said dielectric layers is porous and the other of said dielectric layers is not porous;

a hardmask layer on said second dielectric layer, said hardmask layer having a top surface;

at least one conductive via embedded in said first dielectric layer and said etch stop layer; and at least one conductive line embedded in said adhesion promoter layer, said second dielectric layer and said hardmask layer, said conductive line having a top surface co-planar with the top surface of said hardmask layer.

31. The interconnect structure of claim 30, wherein said first dielectric layer is formed of porous SiCOH and said second dielectric layer is formed of SiCOH.

32. The interconnect structure of claim 30, wherein said first dielectric layer is formed of SiCOH and said second dielectric layer is formed of porous SiCOH.

* * * * *